United States Patent [19]

Tamura et al.

[11] Patent Number: 4,806,883
[45] Date of Patent: Feb. 21, 1989

[54] MULTIFREQUENCY OSCILLATOR CIRCUIT

[75] Inventors: Takahiko Tamura, Tokyo; Hiroyuki Suzuki, Kanagawa, both of Japan

[73] Assignee: Sony Corporation, Tokyo, Japan

[21] Appl. No.: 124,594

[22] Filed: Nov. 24, 1987

[30] Foreign Application Priority Data

Nov. 27, 1986 [JP] Japan ................................. 61-282672

[51] Int. Cl.⁴ ............................................... H03K 3/26
[52] U.S. Cl. .................................. 331/111; 331/177 R
[58] Field of Search ............... 331/108 R, 111, 113 R, 331/143, 144, 177 R

[56] References Cited

U.S. PATENT DOCUMENTS 3,895,315 7/1975 Way ..................................... 331/111
4,551,691 11/1985 Ogawa ................................. 331/111

FOREIGN PATENT DOCUMENTS 1354948 5/1974 United Kingdom .

Primary Examiner—Eugene R. LaRoche
Assistant Examiner—Robert J. Pascal
Attorney, Agent, or Firm—Lewis H. Eslinger; Jay H. Maioli

[57] ABSTRACT

Oscillation circuit that generates an oscillating signal by charging and discharging a capacitor between two reference voltages employs several constant current sources, with the number of constant current sources that are connected to the capacitor at any one time being controlled so that the oscillation frequency can be changed in a step-wise fashion, whereby the circuitry is relatively simplified compared with known step-wise changing oscillators.

6 Claims, 3 Drawing Sheets

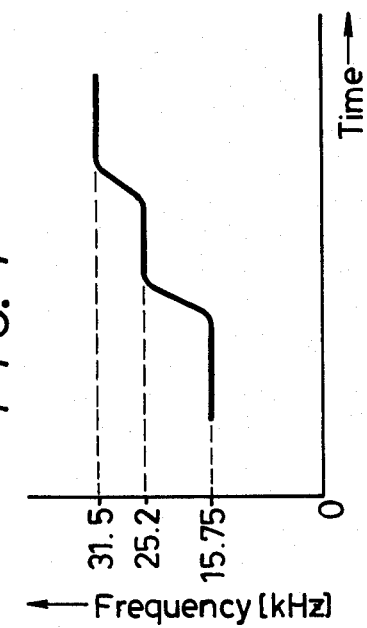
FIG. 4
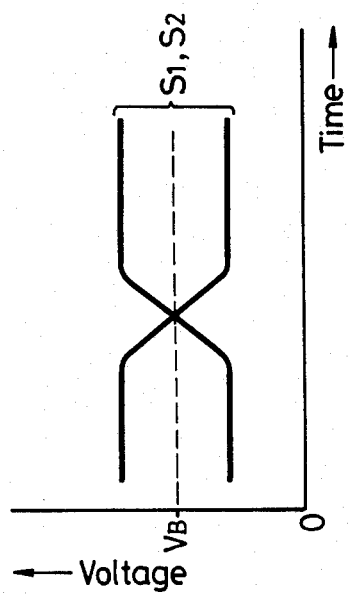
FIG. 2
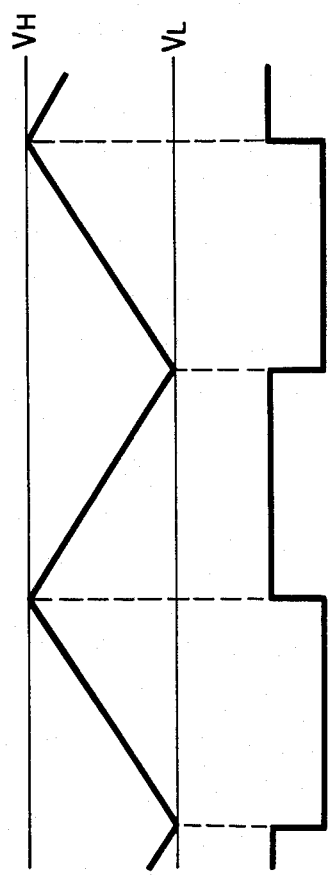
FIG. 3A (Vc)
FIG. 3B (Sq)

MULTIFREQUENCY OSCILLATOR CIRCUIT

BACKGROUND OF THE INVENTION

1 Field of the Invention

This invention relates generally to an oscillator and, more particularly, to an oscillator suitable for use in the horizontal oscillation circuit of a multi-scan television receiver.

2. Description of the Background

The so-called multi-scan television receiver must be capable of displaying signals that may include a video signal from a micro-computer output, as well as a standard video signal produced in accordance with one of the standard video formats. The problem is then presented that the horizontal frequency of the various signals may not be identical. More specifically, a video signal produced according to the NTSC system has a horizontal frequency of 15.75 kHz. On the other hand, the video signal from a micro-computer has a horizontal frequency of from 24 to 25 kHz. Another signal that is frequently displayed in a multi-scan type television receiver is a double-speed video signal, so that such double-speed video signal in the NTSC system will have a horizontal frequency of 31.5 kHz. In order to accommodate these various signals the horizontal oscillation circuit in the so-called multi-scan television receiver is designed so as to be capable of continuously changing the oscillation frequency in a range of from roughly 15.75 kHz to 31.5 kHz.

One known approach to achieving this variable oscillation frequency is to use the frequency of the input horizontal synchronizing pulse to derive a voltage and then to use that voltage as a control voltage to vary the oscillation frequency of the horizontal oscillator. Accordingly, it will be appreciated that a large number of adjustments are required in order to properly change the oscillation frequency so that it can closely follow the changes in frequency of the horizontal synchronizing pulses of the input signal. This then requires relatively complex circuitry that provides increased cost and decreased reliability to the multi-scan television receiver.

OBJECTS AND SUMMARY OF THE INVENTION

Accordingly, it is an object of the present invention to provide an oscillation circuit that can eliminate the above-noted defects inherent in the prior art.

Another object of this invention is to provide an oscillation circuit that has a simplified construction and may be fabricated as an integrated circuit.

A further object of this invention is to provide an oscillation circuit suitable for use as the horizontal oscillation circuit in a multi-scan television receiver.

In accordance with an aspect of the present invention, an oscillation circuit is provided that generates an oscillation signal by charging and discharging a capacitor between two reference voltage levels. This oscillation circuit in one embodiment can comprise a number of constant current sources that have the exact same current value, along with switching circuits that are connected between the constant current sources and the capacitor. In this fashion, the switching circuits change the number of constant current sources that are connected to the capacitor, thereby changing the frequency of oscillation in a step-wise fashion.

The above and other objects, features, and advantages of the present invention will become apparent from the following description of illustrative embodiments thereof, to be read in conjunction with the accompanying drawings, in which like reference numerals represent the same or similar elements.

BRIEF DESCRIPTION OF THE DRAWINGS

FIG. 2 is a graphical representation showing switching control signals for use in the embodiment of FIG. 1;

FIGS. 3A and 3B are graphical representations useful in explaining the variation in the frequency of oscillation according to the present invention;

FIG. 4 is a graphical representation showing the variation in output frequency of the embodiment of FIG. 1.

DETAILED DESCRIPTION OF PREFERRED EMBODIMENTS

Figure 1:
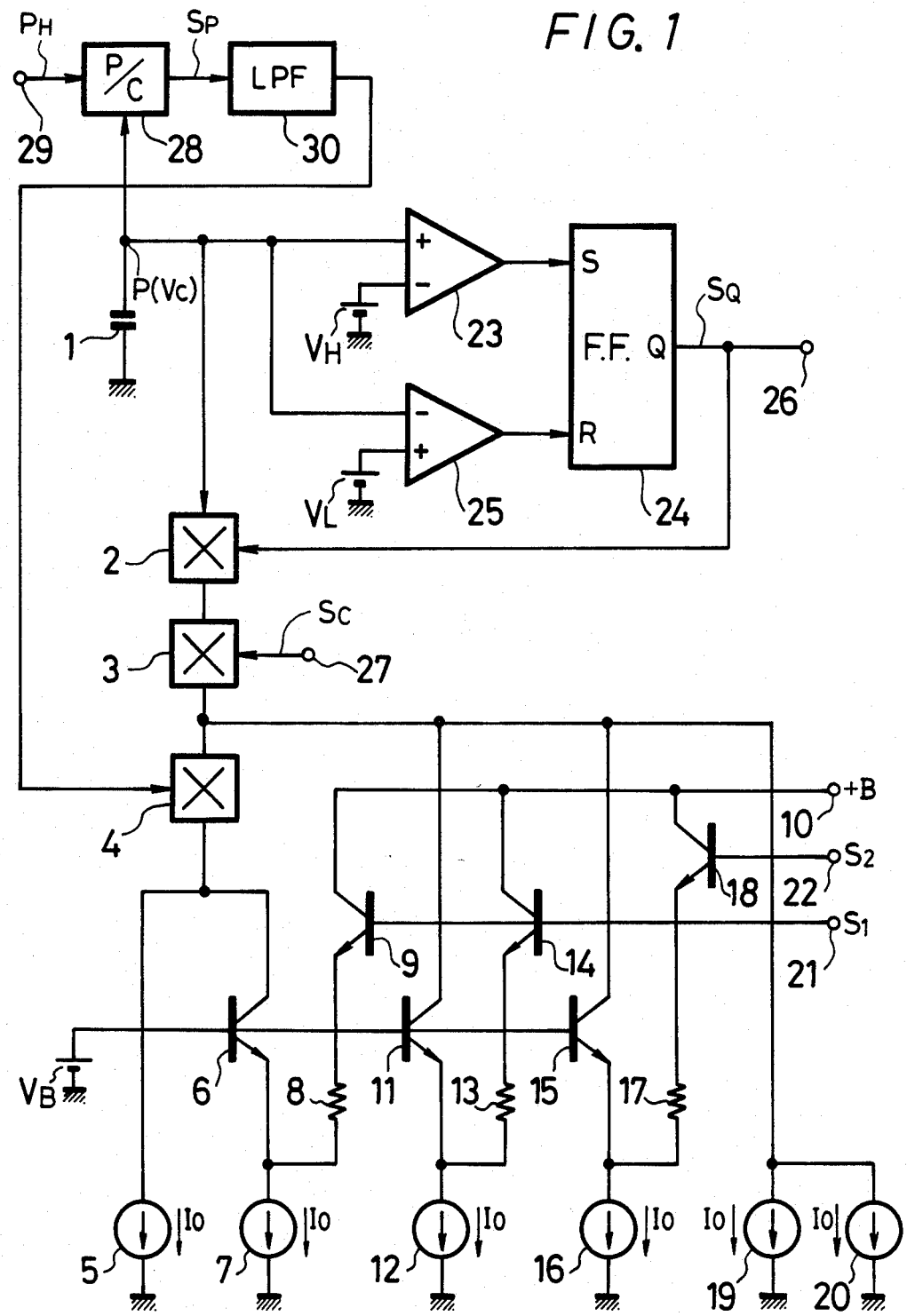
FIG. 1 is a schematic diagram of an oscillation circuit for producing selected frequency output signals according to the present invention.

The embodiment shown in FIG. 1 is particularly adapted for use as the horizontal oscillation circuit in a multi-scan television receiver that can display pictures according to the NTSC system in which the video signal has a horizontal frequency at 15.75 kHz, video signals having horizontal frequencies of 24 to 25 kHz as might be produced by a micro-computer, for example, and a double-speed video signal from an NTSC system having a horizontal frequency of 31.5 kHz. Accordingly, the embodiment of FIG. 1 is intended to produce or to change the oscillation frequency $f_0$ step-wise among the various frequencies of 15.75 kHz, 25.2 kHz, and 31.5 kHz. The frequency 25.2 kHz is close enough to the horizontal frequencies 24 to 25 kHz of a video signal produced by a micro-computer so as not to noticeably degrade the displayed image.

Figure 5:
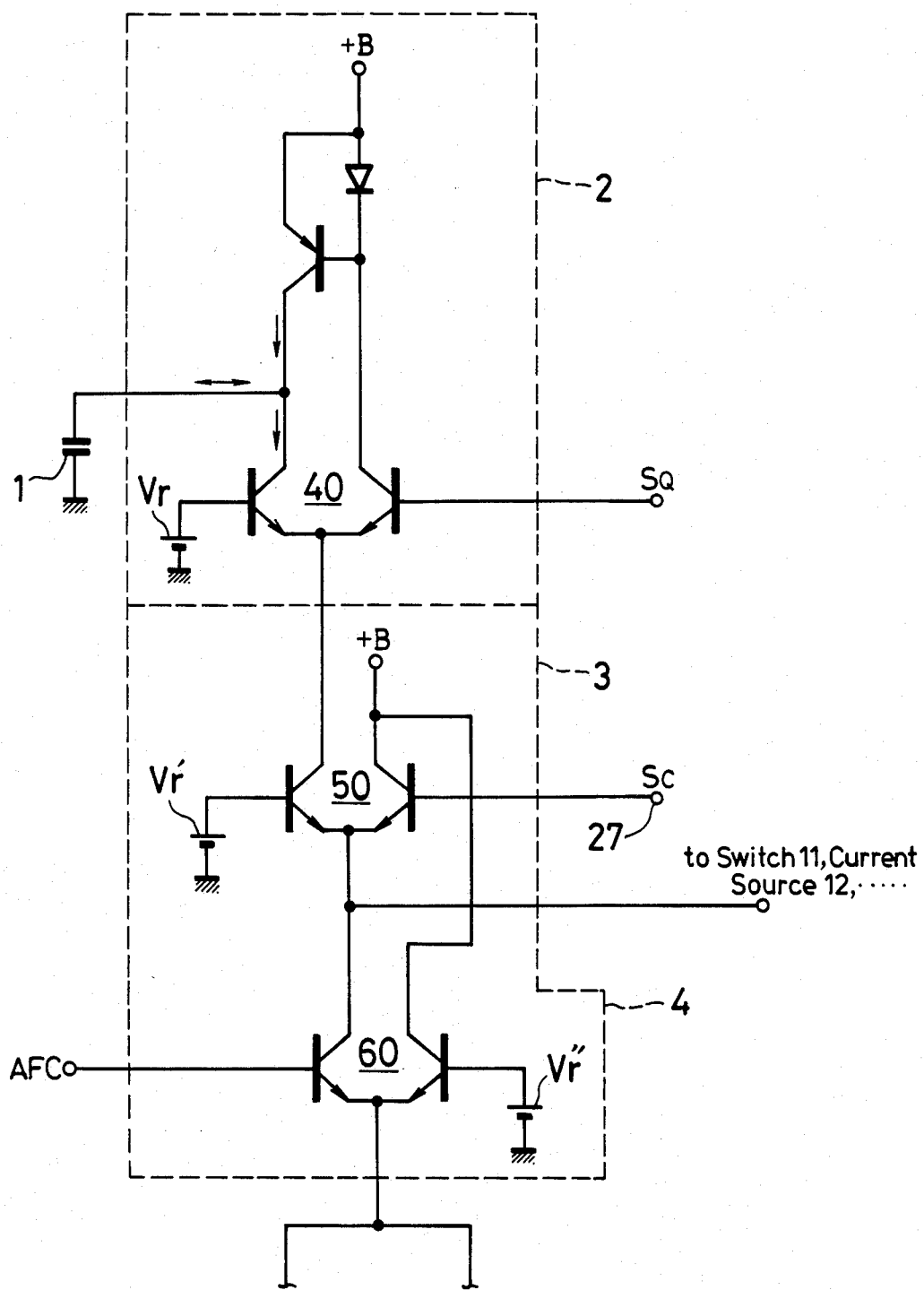
FIG. 5 is a schematic diagram of the current multipliers used in the embodiment of FIG. 1.

A charging capacitor 1 is connected at one end to ground and the circuit is completed through a series circuit formed of current multipliers 2, 3, and 4 and a constant current source 5, through which a current $I_0$ flows. At the junction between multiplier 4 and constant current source 5 the circuit is further connected to ground through a series circuit formed of the collector-emitter path of an NPN transistor 6 and a second constant current source 7 that also provides current $I_0$. Similarly, the junction between the emitter circuit of transistor 6 and constant current source 7 is connected through a series circuit formed of a resistor 8 and the emitter-collector junction of an NPN transistor 9 to the power supply at terminal 10, at which a positive DC voltage (+B) is connected. Resistor 8 is provided to lower the switching sensitivity of transistor 9. The junction between multipliers 3 and 4 is connected to ground in a first path through a series circuit of the collector-emitter junction of an NPN transistor 15 and a third constant current source 16 that also provides a current $I_0$. The junction between transistor 15 and constant current source 16 is connected to the DC voltage at terminal 10 by a resistor 17 and the emitter-collector junction of an NPN transistor 18. Again, resistor 17 operates to lower the switching sensitivity of transistor 18. In addition, the junction between current multipliers 3 and 4 is further connected to ground by a parallel circuit formed of fourth and fifth constant current sources 19, 20 that also each provide a current $I_0$. A typical example of current multipliers such as 2, 3, or 4 is shown in FIG. 5.

Transistors 6, 11, and 15 are biased by a bias voltage $V_B$ provided by a suitable DC voltage source. Similarly, a switching control signal $S_1$ is supplied to the bases of transistors 9 and 14 from input terminal 21, and a switching control signal $S_2$ is fed in at terminal 22 to the base of transistor 18.

In this embodiment, when the oscillation frequency $f_0$ is required to be 15.75 kHz, the levels of the control signal $S_1$ and $S_2$ fed in at input terminals 21 and 22, respectively, are made to be higher than the level of voltage $V_B$ so that transistors 9, 14, and 18 are turned on, whereas transistors 6, 11, and 15 forming a differential pair are turned off. When it is desired to have an output signal having a frequency of 25.2 kHz, the level of control signal 21 is made lower than the voltage $V_B$, and the level of control signal $S_2$ that controls transistor 18 is made higher than voltage $V_B$. In this way transistors 9, 14 are turned off, transistor 18 is turned on, and transistor 6, 11 are turned on as well, with transistor 15 being turned off.

In this embodiment, when the frequency $f_0$ of the output signal is desired to be 31.5 kHz, the levels of both control signals $S_1$ and $S_2$ are made lower than voltage $V_B$, so that transistors 9, 14, and 18 are turned off and transistors 6, 11, and 15 are turned on.

In order that the desired output signal frequency change occurs over a known time period, the control signals $S_1$ and $S_2$ are changed or altered in level at predetermined times, or with predetermined time constants, as shown for example in FIG. 2. Therefore, by the cooperation of resistors 8, 13, and 17 respective transistors 6, 11, and 15, change their states from the on-state to the off-state or from the off-state to the on-state within predetermined times.

In regard to constant current sources 5, 7, 12, 16, 19 and 20, these sources all produce the same current value, $I_0$, and upon constructing these constant current sources using integrated circuit techniques, the currents $I_0$ can be identically produced with high precision.

The voltage across capacitor 1 at point P is denoted as $V_c$, and this voltage is applied to the positive input of a comparator 23, which compares the voltage $V_c$ with a reference voltage $V_H$. Comparator 23 then produces a low output signal when the junction voltage $V_c$ is smaller than the reference voltage $V_H$ and produces a high voltage level at its output when the junction voltage $V_c$ is larger than the reference voltage $V_H$. The output from comparator 23 is fed to the set input terminal S of an RS flip-flop 24. Flip-flop 24 is set when the signal from comparator 23 changes from a low level to a high level, that is, when the junction voltage $V_c$ undergoes a transition from less than the reference voltage $V_H$ to greater than the reference voltage $V_H$. The effect of setting flip-flop 24 is to produce a signal $S_Q$ having a high level at the flip-flop output Q. The voltage $V_c$ at point P is also fed to the negative input of a second comparator 25, wherein it is compared with another reference voltage $V_L$ where reference voltage $V_L$ is less than reference voltage $V_H$. Comparator 25 produces an output signal having a low level when the junction voltage $V_c$ is greater than the reference voltage $V_L$ and, conversely, comparator 25 produces an output having a high level when the junction voltage $V_c$ is smaller than reference voltage $V_L$. The output of comparator 25 is fed to the reset terminal R of flip-flop 24. Thus, flip-flop 24 is reset when the output signal of comparator 25 undergoes a transition from the low level to the high level, that is, when the junction voltage $V_c$ rises from a low level to a high level. The effect of the reset of flip-flop 24 is to produce a low level signal at the flip-flop output Q.

The flip-flop output signal $S_Q$ is fed to multiplier 2 and is utilized as the control signal therefor. This is shown in more detail in the circuit of FIG. 5. Thus, when signal $S_Q$ is at a low level multiplier 2 multiplies a current flowing therethrough by $+1$ and a charging current then flows into capacitor 1, thereby charging it accordingly. On the other hand, when flip-flop output signal $S_Q$ is at a low level multiplier 2 multiplies a current flowing therethrough by $-1$ and a discharge current flows out of capacitor 1, thereby discharging capacitor 1. In this case, when voltage $V_c$ becomes large than reference voltage $V_H$ flip-flop 24 produces a high level output signal $S_Q$. Consequently, multiplier 2 multiplies the current by $-1$ and discharge current flows out of capacitor 1, thereby discharging the capacitor and lowering the capacitor voltage $V_c$. When capacitor voltage $V_c$ becomes smaller than the reference voltage $V_L$ flip-flop 24 is reset to once again produce a low output signal $S_Q$, which has the result of causing multiplier 2 to multiply the current by $+1$ and causing a charging current to flow into capacitor 1, thereby charging capacitor 1 to once again increase the capacitor voltage $V_c$. When the capacitor voltage $V_c$ becomes larger than reference voltage $V_H$ flip-flop 24 will be set, thereby producing an output signal $S_Q$ having a high level, which by reason of the control of multiplier 2 will once again cause capacitor 1 to be discharged. Thereafter, in a similar fashion capacitor 1 is repeatedly charged and discharged between reference voltages $V_H$ and $V_L$.

Accordingly, the voltage $V_c$ developed at junction P will vary as represented in FIG. 3A and the output signal $S_Q$ at the output of flip-flop 24 will vary as shown at in FIG. 3B. Signal $S_Q$ then is delivered to output terminal 26 as the desired horizontal oscillation signal.

Multiplier 3 also receives a control signal $S_c$ that is employed in finely adjusting the oscillation frequency. Control signal $S_c$ is fed in at terminal 27 to multiplier 3 and operates so that multiplier 3 multiplies the current flowing therethrough by a predetermined coefficient K so as to be regulated in the distribution of current value $I_0$. In this embodiment the values of the components are selected so that the free-run frequency, or the frequency of voltage $V_c$ or of the flip-flop output signal $S_Q$, at a time when transistors 6, 11, and 15 are turned off and the control signal at terminal 27 causes multiplier 3 to multiply the current by 0.5, will be 15.75 kHz.

In this embodiment, if only one current source, for example 19, is conducting and the other current sources, 5, 7, 12, 16, 20 are all turned off, the free-run frequency of the circuit of FIG. 1 will be nearly 5kHz. Furthermore, when two current sources 19, 20 are conducting and all others are turned off then the free-run frequency will be approximately 10 kHz. Therefore, it is seen that the free-run frequency of the circuit of FIG. 1 is selected to be 15.75 kHz in the condition where control signals $S_1$ and $S_2$ are both high and the multiplying coefficient supplied to multiplier 4 equals 0.5.

The voltage developed at point P across capacitor 1 is also fed to a phase comparator 28 where it is compared with a horizontal synchronizing pulse $P_H$ fed in at terminal 29. This signal at terminal 29 is derived from the actual signal to be displayed on the multi-scan television receiver using the horizontal oscillation signal generated by the embodiment of FIG. 1. More specifically, phase comparator 28 produces a phase compared output signal $S_p$ that is fed through a low-pass filter 30 to produce a control signal fed to multiplier 4. In this embodiment when the phase of the capacitor voltage $V_c$ is the same as that of the horizontal sync pulse $P_H$, as determined in phase comparator 28, multiplier 4 will multiply the current by a coefficient of 0.5, while in the case where the phase of the voltage $V_c$ is either ahead of or behind the phase of the horizontal synchronizing pulse $P_H$, multiplier 4 will multiply the current by a coefficient that is either larger or smaller than 0.5, in accordance with the actual phase difference as detected.

As will be appreciated from the above, multiplier 2 is provided to perform the actual switching of the direction of current flow in capacitor 1. Therefore, to maintain an oscillating signal multiplier 2 is absolutely necessary. On the other hand, multiplier 3 is provided for fine control of the oscillation frequency and by use of this multiplier the free-run frequency can be finely adjusted to 15.75 kHz or other specific value. In regard to applying a control signal value of 0.5, this is a selected circuit design outer value between 0, (all off) and 1 (all passed). In other words, the maximum dynamic range of adjustment.

In order to understand this operation more clearly the following example is set forth. In this example it is assumed that the phase of the capacitor voltage $V_c$ is the same as that of the horizontal synchronizing pulse $P_H$, that is, the coefficient by which multiplier 4 multiplies the current will be 0.5. If the frequency of oscillation $f_0$ is selected to be 15.75 kHz, the levels of control signals $S_1$ and $S_2$ are made larger than voltage $V_B$ so that transistors 6, 11, and 15 are turned off. In addition, as pointed out above, since the oscillation frequency $f_0$ is adjusted as the free-run frequency it will be 15.75 kHz. Then, because constant current sources 5, 19 and 20 are connected through multipliers 2, 3, and 4 to capacitor 1 the magnitude $I'$ of the charging and discharging current of capacitor 1 is expressed as follows:

$$I' = (0.5I_0 + 2I_0) \times K = 2.5kI_0 \quad (1)$$

On the other hand, when the frequency of oscillation $f_0$ is selected to be 25.2 kHz, control signal $S_1$ will be selected to be lower in level than reference voltage $V_B$ and control signal $S_2$ is selected to be higher in level than voltage $V_B$, whereby transistors 6, 11 are turned on and transistors 15 is turned off. Consequently, because capacitor 1 is connected with constant current sources 5, 7, 12, 19, and 20 through multipliers 2, 3, and 4 the charging and discharging current $I'$ of capacitor 1 at that time is expressed as follows:

$$I' = (0.5 \times 2I_0 + 3I_0) \times K = 4KI_0 \quad (2)$$

Therefore, because the current set forth in equation (2) above is (4/2.5) times as large as that expressed in equation (1) the oscillation frequency $f_0$ will be $15.75 \times (4/2.5)$ kHz= to 25.2 kHz.

In the case where the frequency of oscillation $f_0$ is selected to be 31.5 kHz, control signals $S_1$ and $S_2$ are both selected to be lower in level than voltage $V_B$ thereby turning on transistors 6, 11, and 15. Consequently, constant current sources 5, 7, 12, 16, 19, and 20 are all connected through multipliers 2, 3, and 4 to capacitor 1, so that the charging and discharging current $I'$ of capacitor 1 at that time is expressed as follows:

$$I' = (0.5 \times 2I_0 + 4I_0) \times K = 5KI_0 \quad (3)$$

Accordingly, because the current of equation (3) is 5/(2.5) times as large as that of equation (1), the frequency of oscillation $f_0$ becomes $15.75 \times (5/2.5)$ kHz=31.5 kHz.

As a further example, the situation in which the phase of the capacitor voltage $V_c$ is either delayed or advanced relative to that of the horizontal synchronizing pulse $P_H$ is described. In such case, because the coefficient by which multiplier 4 multiplies the current is larger or smaller than 0.5, depending upon the actual phase difference detected in phase comparator 28, the charging and discharging current $I'$ of capacitor 1 will be increased to decreased accordingly, thereby delaying or advancing the phase of voltage $V_c$. Thus, the phase of voltage $V_c$ can be controlled to become equal to that of the horizontal sync pulses $P_H$ fed in at input terminal 29.

Therefore, it is seen that by using the embodiment of FIG. 1 is possible to obtain a horizontal oscillation signal $S_Q$ having frequencies 15.75 kHz, 25.2 kHz, and 31.5 kHz, all of which are synchronized with the horizontal synchronizing pulse $P_H$, without requiring any individual adjustments to be made in the circuitry. Because no adjustments become necessary, the oscillation circuit is simplified accordingly.

Furthermore, in the embodiment of FIG. 1, because the levels of the control signals $S_1$ and $S_2$ are changed with a specific time constant, as represented in FIG. 2, and because resistors 8, 13, and 17 are provided to lower the switching sensitivity, transistors 6, 11, and 15 can change from the on-state to the off-state or, conversely, from the off-state to the on-state, in a predetermined or known time. In other words, the charging and discharging current $I'$ of capacitor 1 changes over a predetermined length of time. For this reason, when the oscillation frequency is changed for example from 15.75 kHz to 25.2 kHz to 31.5 kHz in such order, as represented in FIG. 4, the frequency transitions are relatively smooth due to lack of transients that would otherwise be caused if the frequency transitions were to occur too sharply. Therefore, large stress is avoided from being applied to the deflection circuitry, such as the fly-back transformer or the horizontal output transformer, and, thus, damage to these circuits is prevented which would adversely affect reliability of the television receiver.

Although there are various forms that can be taken by the current multipliers used in the embodiment of FIG. 1, FIG. 5 shows schematically circuitry for multipliers 2, 3, and 4. More specifically, multiplier 2 directly controls current flow in capacitor 1 and includes a transistor differential pair 40, connected by respective collector circuits to the bias voltage +B. One input to transistor pair 30 is the flip-flop output $S_Q$ and the other is a reference voltage $V_r$. Reference voltage $V_r$ is selected to have a level midway between the maximum and minimum values of the squarewave output signal $S_Q$. In the case of multiplier 3, which is the fine frequency control, a second pair of differentially connected transistors 50 is provided, with one transistor receiving the control signal $S_c$ and the other transistor connected to a reference voltage $V_r'$ selected in view of the signal level of control signal $S_c$. Finally, multiplier 4 is also a differential transistor pair 60 that has one transistor connected to the automatic frequency control (AFC) signal from low-pass filter 30 and the other transistor is connected to a reference voltage $V_r''$ based upon the center value about which the AFC signal varies.

It should be understood that frequencies of oscillation given in the above example are examples only and the oscillation signal having any desired frequency can be similarly obtained. Furthermore, although the present invention is described in relation to a horizontal oscillation circuit for use in a multi-scan television receiver, the present invention can also be applied to any oscillation circuit for generating oscillation signals that are required to have a number of different fixed oscillation frequencies.

According to the present invention, as described above, the oscillation frequency is varied in a step-wise fashion by changing the number of constant current sources connected to the charging capacitor so that no adjustment is necessary, except that the number of constant current sources connected to a charging capacitor is selectively controlled. In this fashion the plurality of necessary frequencies can be obtained by using this simplified construction.

It should be understood that the above description is presented by way of example only on a single preferred embodiment of the invention and it will be apparent that many modifications and variations thereof could be effected by one with ordinary skill in the art without departing from the spirit and scope of the novel concepts of the invention, so that the scope of the invention should be determined only by the appended claims.

What is claimed is:

1. An oscillation circuit for generating an oscillation signal by charging and discharging a capacitor between two reference voltages, comprising:
    a plurality of constant current sources each having the same current value; and
    switching circuits connected between said plurality of constant current sources and said capacitor, wherein said switching circuits selectively change the number of said constant current sources connected to said capacitor, thereby to step-wise change the frequency of said oscillation signal.

2. An oscillation circuit according to claim 1, further comprising current multiplier means connected between said switching circuits and said capacitor.

3. An oscillation circuit according claim 2, in which said oscillation circuit is used in a video system and further comprising means for comparing the phase of a voltage across said capacitor with the phase of a horizontal synchronizing pulse in a video signal and providing a phase comparison signal to said current multiplier means.

4. An oscillator circuit according to claim 2, wherein and said current multiplier circuit comprises three current multipliers mutually connected in series and in series between said capacitor and said switching circuits.

5. An oscillation circuit according to claim 1, wherein currents produced by respective ones of said plurality of constant current sources are substantially equal.

6. An oscillator circuit according to claim 1, wherein said switching circuits comprise a plurality of differentially connected transistors.

* * * * *